United States Patent [19]

Huffer

[11] Patent Number: 4,790,922

[45] Date of Patent: Dec. 13, 1988

[54] TEMPERABLE LOW EMISSIVITY AND REFLECTIVE WINDOWS

[75] Inventor: Russell Huffer, Owatonna, Minn.

[73] Assignee: Viracon, Inc., Owatonna, Minn.

[21] Appl. No.: 72,775

[22] Filed: Jul. 13, 1987

[51] Int. Cl.⁴ ............................................. C23C 14/34
[52] U.S. Cl. ........................ 204/192.27; 204/192.26; 428/432; 65/102
[58] Field of Search ...................... 204/192.26, 192.27; 427/160, 166; 428/432; 65/102

[56] References Cited

U.S. PATENT DOCUMENTS

| | | | |
|---|---|---|---|
| 4,413,877 | 11/1983 | Suzuki | 350/1.7 |
| 4,497,700 | 2/1985 | Groth et al. | 204/192.27 |
| 4,548,691 | 10/1985 | Dietrich et al. | 204/192.27 |
| 4,610,771 | 9/1986 | Gillery | 204/192.1 |

Primary Examiner—Aaron Weisstuch
Attorney, Agent, or Firm—Steven E. Kahm

[57] ABSTRACT

The invention relates to using titanium as a protective layer on either side of a layer of silver for making temperable low emissivity windows. The titanium layers will protect the silver layer from oxidizing when the glass is heated to shape the glass. The invention also can be used to protect a layer of stainless steel when making temperable reflective windows.

9 Claims, 1 Drawing Sheet

TEMPERABLE LOW EMISSIVITY AND REFLECTIVE WINDOWS

BACKGROUND OF THE INVENTION

In the past few years low emissivity and reflective windows have been introduced to the market and have become very popular. Low emissivity windows are popular because they can reduce the heating and cooling costs of buildings by reflecting most of the infrared radiation while allowing in most of the visible radiation. Reflective windows also reduce heating costs by reflecting unwanted radiation. Also in the past few years architects have been designing buildings with curved panes of glass and it would be advantageous to have this glass coated with a low emissivity coating. There are also other needs for curved low emissivity and reflective glass panes which can be bent or shaped as specified such as for use in cars.

Most curved glass cannot fit through or be evenly coated in a sputtering machine due to the degree of arc in the curve of the glass. Therefore a flat piece of glass needs to be bent to the desired shape after the coating has been applied. Unfortunately, to bend a piece of glass it has to be heated to be shaped and this heating and bending will ruin most coatings.

If a slightly bent piece of glass can fit into and be coated in a sputtering machine there is a high rate of breakage in the cleaning process following the coating, therefore it is advantageous to sputter a flat piece of glass and then bend it.

Currently the only method known to the applicant of providing temperable low emissivity coatings on glass such that the glass may be heated and shaped is by using a glass substrate coated with a first layer of tin oxide, a second layer of aluminum, a third layer of silver, a fourth layer of aluminum and a fifth layer of tin oxide. Then the glass is heated to shape it.

One disadvantage of this method is that the heat levels must be carefully controlled. When heated, the aluminum layers will absorb oxygen, forming aluminum oxide layers. If the temperature gets too high the silver layer will also oxidize, ruining the visibility though the coating.

Another disadvantage of the above method is that sputtering aluminum is a difficult procedure. Since aluminum is a good conductor it arcs during sputtering, and it is not a clean material to sputter.

There are sputtering machines such as Airco Solar Product's coater on the market for sputtering layers of metals on a substrate. Airco's machine has 5 separate chambers having 3 cathodes in each chamber. Each cathode may be a different metal and the atmospheres in each chamber may be a different gas at a different pressure. Each cathode may be energized at a different voltage and the speed of the glass in the chambers may be varied to increase or decrease the thickness of the layers of metal deposited on the substrate.

Once the cathodes are in place it requires about 2 days of down time to change the cathodes. Because of this down time it is important to be able to make several products without having to change the cathodes.

It is therefore commercially important to make a large variety of products without having to change the cathodes. Switching cathodes within the machine can be done by shutting off or turning on one or more of the 15 cathodes in the 5 chambers. It is easy to change the atmosphere of a chamber. A wide variety of combinations can then be selected without causing expensive down time.

Applicant has been manufacturing Regular Low Emissivity glass by using this type of sputtering machine in which the first chamber has an oxygen atmosphere and the 3 cathodes are first zinc, second tin, and third zinc. The substrate is then coated with a zinc tin oxide mixture. In the second chamber the cathodes are first titanium, second silver, and third titanium. This chamber has an argon atmosphere, which is an inert gas to promote the layers being pure titanium and silver. Only the second and third cathodes are turned on in this chamber to provide a layer of silver and a layer of titanium. The third chamber has a first cathode of tin, a second cathode of zinc and a third cathode of tin, in an oxygen atmosphere. This produces a tin zinc oxide mixture layer. The fourth chamber has a first cathode of stainless steel, a second cathode of titanium, and a third cathode of titanium. Only the titanium cathodes are turned on in this chamber. The atmosphere in this chamber is oxygen which produces a titanium oxide layer. The fifth chamber has all three cathodes of titanium in an oxygen atmosphere. This produces a titanium oxide layer.

For another product, the Sun Low Emissivity window, all the cathodes are the same but the last two chambers have a nitrogen atmosphere instead of an oxygen atmosphere. This produces a titanium nitride for the outer layers instead of a titanium oxide.

Another product made on this machine is a high performance insulating reflective glass using the stainless steel of chamber four, cathode one, in an argon atmosphere for the first layer coated on a glass substrate and having a second layer of titanium using all three cathodes of titanium in the fifth chamber in a nitrogen atmosphere for a titanium nitride layer.

Another product uses all the titanium cathodes in a nitrogen atmosphere to give a titanium coating.

Many other combinations of coatings are possible.

In order to manufacture bendable low emissivity coatings on glass by the known method the sputtering machine would have to be shut down to change the cathodes in chamber 2 from aluminum to titanium, causing down time and lost production.

The inventor has developed a coating that will not be damaged in the heating and shaping process using a layer of titanium on each side of a layer of silver.

Using titanium has several advantages.

First, there is no down time to change cathodes in the sputtering machine.

Second, titanium will not absorb oxygen as easily as aluminum when heated and therefore will protect the silver from oxidizing better during the heating and shaping process, thus reducing the rejection rate.

Third, titanium is easier to sputter. It does not have the arcing problems of aluminum, it sputters more cleanly and therefore requires less cleaning.

Fourth, Titanium is a harder, more scratch resistant material than aluminum.

Fifth, titanium is slightly more transparent to visible light than aluminum.

And sixth, titanium oxide aesthetically looks better than aluminum.

Using the same machine and cathodes with a split cathode having silver and stainless steel for the silver cathode a temperable reflective glass can be produced.

SUMMARY OF THE INVENTION

The invention is a method of producing temperable low emissivity glass and a temperable reflective glass.

By using titanium as a protective layer on either side of a silver layer the glass can be heated and shaped without oxidizing the silver layer for producing low emissivity glass.

By using titanium as a protective layer on either side of a stainless steel layer the glass can be heated and shaped without oxidizing the stainless steel layer for producing reflective glass.

The method of producing the temperable low emissivity glass consists of coating the glass with a first layer of a tin and zinc oxide, a second layer of titanium, a third layer of silver, a fourth layer of titanium, a fifth layer of a zinc and tin oxide, and a sixth layer of titanium oxide. The coated glass is then heated and bent to the desired shape. The coating will not be damaged by the heating and bending.

The method of producing temperable reflective glass is the same except the stainless steel layer is substituted for the silver layer.

The advantages of this system over the prior art is that titanium is easier to sputter than aluminum, it is harder than aluminum and therefore more scratch resistant, it is more transparent than aluminum, and aesthetically it tints the glass a clear blue color which is preferred over aluminum.

A further advantage is that the sputtering machine does not have to be shut down to change metals in the chambers to make products of the above described product mix. A still further advantage is that the titanium layers on either side of the silver layer will oxidize at a lower energy level than aluminum, thus protecting the silver from oxidizing and ruining the visibility characteristics of the coating during the heating and shaping steps.

DESCRIPTION OF THE PREFERRED EMBODIMENT

Figure 1:
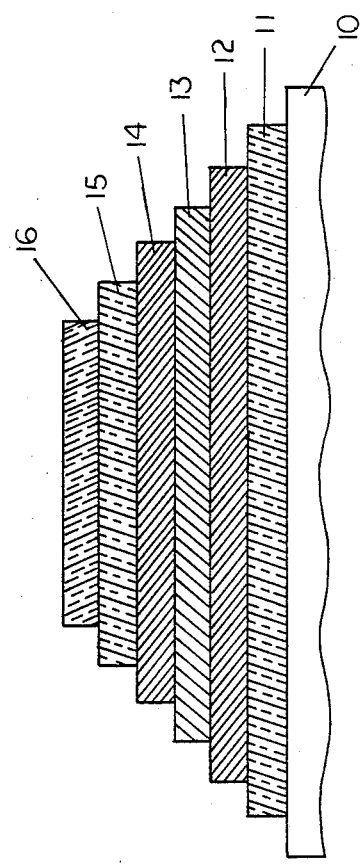
FIG. 1 shows the layers of coatings on the glass for a temperable low emissivity glass and for a temperable reflective glass.

In the preferred embodiment a five chamber sputtering machine is used. Each chamber in the machine should have three cathodes. And at least one of those cathodes should be a split cathode allowing one of two metals to be used in that position.

In the first chamber the first cathode should be zinc, the second cathode tin, and the third cathode zinc.

The second chamber should have a first cathode of titanium, a second cathode of silver, or depending on the product run, a split cathode having silver as one target and stainless steel as the other target and a third cathode of titanium. The split cathode can be energized either for depositing a layer of silver or alternatively for depositing a layer of stainless steel.

The third chamber should have a first cathode of tin, a second cathode of zinc, and a third cathode of tin.

The fourth chamber should have a first cathode of stainless steel, a second cathode of titanium, and a third cathode of titanium.

The fifth chamber should have all three cathodes of titanium.

By loading the sputtering machine in this way a mix of products may be produced without changing cathodes.

The invention to which the claims are drawn is the discovery that by using titanium as protective layers on either side of a layer of silver makes it easier to produce temperable low emissivity glass and by using titanium as a protective layer on either side of a stainless steel layer makes it easier to produce temperable reflective glass.

The titanium layer is superior to the known art of using aluminum as the protective layers in that when heated it protects the silver or stainless steel layer from oxidizing better than does aluminum. Titanium is also easier to sputter than aluminum and, in its oxidized form, it is harder and more scratch resistant than aluminum.

The titanium has the above advantages and the titanium coated low emissivity windows with titanium have almost the same refection and transmission characteristics as other low emissivity windows; however, titanium is slightly more transparent to visible light than aluminum and has a higher emissivity.

For the manufacture of temperable low emissivity windows with a sputtering machine having the targets as shown above, the first chamber will be in an oxygen atmosphere and deposit a first layer 11 of either tin oxide, zinc oxide or a mixture of tin and zinc oxide, on a glass substrate 10, as shown in FIG. 1. The applicant prefers a mixture of tin zinc oxide for this layer.

The second chamber should have an argon atmosphere and deposit a first layer 12 of titanium approximately 50 to 150 angstroms thick, then a layer of silver 13, and then a layer of titanium 14, again approximately 50 to 150 angstroms thick.

The titanium in this thickness should be enough to protect the silver from oxidizing during the tempering of the glass when the glass is heated to be shaped. When the glass is heated the titanium will begin to oxidize but will prevent the silver from oxidizing. If aluminum were used instead of titanium the aluminum would oxidize more readily than the titanium and not protect the silver layer as much. The titanium at 50 to 150 angstroms is still thin enough to give good visibility properties to the window and to aesthetically give the window a clear blue color.

The third chamber should have an oxygen atmosphere and deposit a layer 15 of either tin oxide, zinc oxide or as preferred by the applicant a mixture of a tin and zinc oxide.

The fourth chamber should have an oxygen atmosphere and use only the titanium cathodes for titanium oxide layer 16.

The fifth chamber should also have an oxygen atmosphere and all three cathodes turned on to add to the titanium oxide layer 16.

The glass can then be heated to approximately 1100 degrees fahrenheit and shaped as desired without oxidizing the silver layer which would destroy the low emissivity properties of the window.

The applicant believes that titanium layers on either side of a stainless steel layer will protect the stainless steel from oxidizing as it does for silver and that the layers of titanium, stainless steel, and titanium will produce a temperable reflective window but testing has yet to be completed. Preliminary tests show that it will produce a temperable reflective window.

The method of producing the temperable reflective window is exactly the same as that for producing the low emissivity window described above, only substituting a stainless steel layer for the silver layer in the second cathode of the second chamber of the sputtering machine.

Preferably there will be a split cathode employed so both products can be made during a production run without having to shut down and change the cathodes.

I claim:

1. A method of making a temperable low emissivity window comprising the steps of
    sputtering a first layer of a mixture of tin oxide and zinc oxide onto a glass substrate,
    sputtering a second layer of titanium,
    sputtering a third layer of silver,
    sputtering a fourth layer of titanium,
    sputtering a fifth layer of a mixture of tin oxide and zinc oxide,
    sputtering a sixth layer of titanium oxide,
    then heating and shaping the glass at a temperature where the titanium layers on each side of the silver layer will oxidize but protect the silver from oxidizing.

2. A method of making a temperable low emissivity window as in claim 1 where the titanium layers on each side of the silver layer are between 50 and 150 angstroms thick.

3. A method of making temperable reflective windows comprising the steps of
    sputtering a first layer of a mixture of tin oxide and zinc oxide onto a glass substrate,
    sputtering a second layer of titanium,
    sputtering a third layer of stainless steel,
    sputtering a fourth layer of titanium,
    sputtering a fifth layer of a mixture of tin oxide and zinc oxide,
    sputtering a sixth layer of titanium oxide,
    then heating and shaping the glass at a temperature where the titanium layers on each side of the stainless steel layer will oxidize but protect the stainless steel from oxidizing.

4. A method of making a temperable reflective window as in claim 3 where the titanium layers on each side of the stainless steel layer are between 50 and 150 angstroms thick.

5. A method of making a coated temperable window consisting of,
    using a five chamber sputtering machine having three cathodes per chamber,
    the first chamber having a first cathode of zinc, a second cathode of tin and a third cathode of zinc in an oxygen atmosphere which will coat a piece of glass with tin zinc oxide mixture layer,
    the second chamber has an argon atmosphere and has a first cathode of titanium, a second cathode of a metal and a third cathode of titanium,
    the second chamber coats the tin zinc oxide mixture with a layer of titanium, then coats the titanium with a layer of the metal and coats the metal with a layer of titanium,
    the third chamber having a first cathode of tin, a second cathode of zinc and a third cathode of tin in an oxygen atmosphere which will coat the titanium with a tin zinc oxide mixture layer,
    the fourth chamber having a first cathode of stainless steel, a second cathode of titanium and a third cathode of titanium in an oxygen atmosphere, only the second and third cathodes are turned on in this chamber to produce a titanium oxide layer,
    the fifth chamber has all three cathodes of titanium in an oxygen atmosphere to produce a titanium oxide layer, a heating and shaping the glass at a temperature where the heat oxidizes the titanium layers on each side of the metal layer but the titanium layers protect the metal layer from being oxidized.

6. A method of making a temperable low emissivity window as in claim 5 where the metal is silver.

7. A method of making a temperable low emissivity window as in claim 6 where the titanium layers on each side of the silver layer are between 50 and 150 angstroms thick.

8. A method of making a temperable reflective window as in claim 5 where the metal is stainless steel.

9. A method of making a temperable low emissivity window as in claim 8 where the titanium layers on each side of the stainless steel layer are between 50 and 150 angstroms thick.

* * * * *

Disclaimer 4,790,922.—*Russel Huffer*, Owatonna, Minn. TEMPERABLE LOW EMISSIVITY AND REFLECTIVE WINDOWS. Patent dated Dec. 13, 1988. Disclaimer filed Feb. 4, 1991, by the assignee, Viracon, Inc.

Hereby enters this discliamer to claims 1 and 2 of said patent.
[ *Official Gazette April 30, 1991* ]